(12) United States Patent
Fitzpatrick et al.

(10) Patent No.: US 9,431,113 B2
(45) Date of Patent: Aug. 30, 2016

(54) DATA STORAGE SYSTEM WITH DYNAMIC ERASE BLOCK GROUPING MECHANISM AND METHOD OF OPERATION THEREOF

(71) Applicant: Smart Storage Systems, Inc., Milpitas, CA (US)

(72) Inventors: James Fitzpatrick, Sudbury, MA (US); Mark Dancho, Chandler, AZ (US); James M. Higgins, Chandler, AZ (US); Robert W. Ellis, Phoenix, AZ (US); Bernardo Rub, Sudbury, MA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/334,350

(22) Filed: Jul. 17, 2014

(65) Prior Publication Data

US 2015/0043277 A1 Feb. 12, 2015

Related U.S. Application Data

(60) Provisional application No. 61/863,419, filed on Aug. 7, 2013.

(51) Int. Cl.
*G11C 11/34* (2006.01)
*G11C 16/10* (2006.01)
(Continued)

(52) U.S. Cl.
CPC ............ *G11C 16/10* (2013.01); *G11C 11/5635* (2013.01); *G11C 16/16* (2013.01); *G11C 16/3495* (2013.01)

(58) Field of Classification Search
CPC ... G11C 16/10; G11C 11/5635; G11C 16/16; G11C 16/3495

USPC ............. 365/218, 185.11; 711/159, 147, 209
See application file for complete search history.

(56) References Cited

U.S. PATENT DOCUMENTS 4,048,481 A 9/1977 Bailey, Jr. et al.
4,839,587 A 6/1989 Flatley et al.
(Continued)

FOREIGN PATENT DOCUMENTS

EP 1 956 489 A2 8/2008
EP 1 990 921 A2 11/2008
(Continued)

OTHER PUBLICATIONS

International Search Report and Written Opinion dated Nov. 7, 2014, received in International Patent Application No. PCT/US2014/049732, which corresponds to U.S. Appl. No. 14/334,350, 13 pages (Fitzpatrick).

(Continued)

*Primary Examiner* — Viet Q Nguyen
(74) *Attorney, Agent, or Firm* — Morgan, Lewis & Bockius LLP

(57) ABSTRACT

Systems, methods and/or devices are used to enable dynamic erase block grouping. In one aspect, the method includes (1) maintaining metadata for each erase block of a plurality of erase blocks in a data storage system, wherein a respective metadata for a respective erase block includes one or more characteristics of the respective erase block, (2) allocating a set of erase blocks, of the plurality of erase blocks, as unassociated erase blocks, (3) selecting two or more unassociated erase blocks in accordance with characteristics of the unassociated erase blocks so as to select unassociated erase blocks with similar characteristics, and (4) grouping the two or more unassociated erase blocks with similar characteristics to form a super block.

22 Claims, 4 Drawing Sheets

(51) Int. Cl.
  *G11C 11/56* (2006.01)
  *G11C 16/16* (2006.01)
  *G11C 16/34* (2006.01)

(56) References Cited

U.S. PATENT DOCUMENTS

| | | | |
|---|---|---|---|
| 5,034,744 A | 7/1991 | Obinata | |
| 5,210,854 A | 5/1993 | Beaverton et al. | |
| 5,311,395 A | 5/1994 | McGaha et al. | |
| 5,450,354 A | 9/1995 | Sawada et al. | |
| 5,479,638 A | 12/1995 | Assar et al. | |
| 5,784,174 A | 7/1998 | Fujino et al. | |
| 5,790,828 A | 8/1998 | Jost | |
| 5,930,504 A | 7/1999 | Gabel | |
| 5,949,785 A | 9/1999 | Beasley | |
| 5,963,983 A | 10/1999 | Sakakura et al. | |
| 6,034,897 A | 3/2000 | Estakhri et al. | |
| 6,069,827 A | 5/2000 | Sinclair | |
| 6,091,652 A | 7/2000 | Haehn et al. | |
| 6,275,436 B1 | 8/2001 | Tobita et al. | |
| 6,345,367 B1 | 2/2002 | Sinclair | |
| 6,356,447 B2 | 3/2002 | Scafidi | |
| 6,381,176 B1* | 4/2002 | Kim | G06F 12/0246 365/185.11 |
| 6,381,670 B1 | 4/2002 | Lee et al. | |
| 6,412,080 B1 | 6/2002 | Fleming et al. | |
| 6,529,997 B1 | 3/2003 | Debiez et al. | |
| 6,552,581 B1 | 4/2003 | Gabara | |
| 6,587,915 B1 | 7/2003 | Kim | |
| 6,618,249 B2 | 9/2003 | Fairchild | |
| 6,661,503 B1 | 12/2003 | Yamaguchi et al. | |
| 6,728,913 B1 | 4/2004 | Parker | |
| 6,763,424 B2 | 7/2004 | Conley | |
| 6,775,792 B2 | 8/2004 | Ulrich et al. | |
| 6,778,387 B2 | 8/2004 | Fairchild | |
| 6,850,443 B2 | 2/2005 | Lofgren et al. | |
| 6,854,070 B2 | 2/2005 | Johnson et al. | |
| 6,871,304 B2 | 3/2005 | Hadjihassan et al. | |
| 6,903,972 B2 | 6/2005 | Lasser et al. | |
| 6,906,961 B2 | 6/2005 | Eggleston et al. | |
| 6,975,028 B1 | 12/2005 | Wayburn et al. | |
| 7,082,495 B2 | 7/2006 | DeWhitt et al. | |
| 7,107,389 B2 | 9/2006 | Inagaki et al. | |
| 7,139,864 B2 | 11/2006 | Bennett et al. | |
| 7,233,497 B2 | 6/2007 | Simon et al. | |
| 7,243,186 B2 | 7/2007 | Liang et al. | |
| 7,298,888 B2 | 11/2007 | Hamar | |
| 7,330,927 B1 | 2/2008 | Reeve et al. | |
| 7,333,364 B2 | 2/2008 | Yu et al. | |
| 7,350,101 B1 | 3/2008 | Nguyen et al. | |
| 7,355,896 B2 | 4/2008 | Li et al. | |
| 7,434,122 B2 | 10/2008 | Jo | |
| 7,441,067 B2 | 10/2008 | Gorobets et al. | |
| 7,516,267 B2 | 4/2009 | Coulson et al. | |
| 7,558,109 B2 | 7/2009 | Brandman et al. | |
| 7,613,871 B2 | 11/2009 | Tanaka et al. | |
| 7,620,710 B2 | 11/2009 | Kottomtharayil et al. | |
| 7,620,769 B2 | 11/2009 | Lee et al. | |
| 7,639,532 B2 | 12/2009 | Roohparvar et al. | |
| 7,661,054 B2 | 2/2010 | Huffman et al. | |
| 7,679,948 B2 | 3/2010 | Park et al. | |
| 7,693,422 B2 | 4/2010 | Alicherry et al. | |
| 7,738,502 B2 | 6/2010 | Chang et al. | |
| 7,743,216 B2 | 6/2010 | Lubbers et al. | |
| 7,818,525 B1 | 10/2010 | Frost et al. | |
| 7,827,348 B2 | 11/2010 | Lee et al. | |
| 7,830,164 B2 | 11/2010 | Earle et al. | |
| 7,853,749 B2* | 12/2010 | Kolokowsky | G06F 12/0246 365/218 |
| 7,979,614 B1 | 7/2011 | Yang | |
| 8,000,161 B2 | 8/2011 | Stan et al. | |
| 8,001,135 B2 | 8/2011 | Perlmutter et al. | |
| 8,010,738 B1 | 8/2011 | Chilton et al. | |
| 8,028,123 B2 | 9/2011 | Kilzer et al. | |
| 8,046,645 B2 | 10/2011 | Hsu et al. | |
| 8,051,241 B2 | 11/2011 | Feldman et al. | |
| 8,072,805 B2 | 12/2011 | Chou et al. | |
| 8,095,724 B2 | 1/2012 | Ji et al. | |
| 8,095,765 B2 | 1/2012 | Asnaashari et al. | |
| 8,117,396 B1 | 2/2012 | Fair et al. | |
| 8,127,202 B2 | 2/2012 | Cornwell et al. | |
| 8,145,984 B2 | 3/2012 | Sommer et al. | |
| 8,154,921 B2 | 4/2012 | Mokhlesi et al. | |
| 8,169,825 B1 | 5/2012 | Shalvi et al. | |
| 8,205,028 B1 | 6/2012 | Sakarda | |
| 8,209,677 B2 | 6/2012 | Shintani et al. | |
| 8,219,724 B1 | 7/2012 | Caruso et al. | |
| 8,219,776 B2 | 7/2012 | Forhan et al. | |
| 8,228,701 B2 | 7/2012 | Sokolov et al. | |
| 8,245,101 B2 | 8/2012 | Olbrich et al. | |
| 8,250,621 B2 | 8/2012 | Cha | |
| 8,254,172 B1 | 8/2012 | Kan | |
| 8,259,506 B1 | 9/2012 | Sommer et al. | |
| 8,289,801 B2 | 10/2012 | Smith et al. | |
| 8,296,534 B1 | 10/2012 | Gupta et al. | |
| 8,332,578 B2 | 12/2012 | Frickey, III et al. | |
| 8,363,413 B2 | 1/2013 | Paquette et al. | |
| 8,369,141 B2 | 2/2013 | Sommer et al. | |
| 8,386,700 B2 | 2/2013 | Olbrich et al. | |
| 8,386,860 B2 | 2/2013 | Tseng et al. | |
| 8,397,101 B2* | 3/2013 | Goss | G06F 11/1004 711/209 |
| 8,407,409 B2 | 3/2013 | Kawaguchi | |
| 8,464,106 B2 | 6/2013 | Filor et al. | |
| 8,503,238 B1 | 8/2013 | Wu et al. | |
| 8,521,981 B2 | 8/2013 | Strauss et al. | |
| 8,560,770 B2* | 10/2013 | Haines | G06F 12/0246 365/185.33 |
| 8,601,203 B2 | 12/2013 | Holbrook et al. | |
| 8,612,669 B1 | 12/2013 | Syu et al. | |
| 8,612,804 B1 | 12/2013 | Kang et al. | |
| 8,661,184 B2 | 2/2014 | Wood et al. | |
| 8,694,811 B2 | 4/2014 | Raju et al. | |
| 8,725,931 B1 | 5/2014 | Kang | |
| 8,750,052 B2 | 6/2014 | Aoki et al. | |
| 8,793,556 B1* | 7/2014 | Northcott | G06F 11/1068 365/185.29 |
| 8,799,747 B2* | 8/2014 | Goss | G06F 11/1068 714/746 |
| 8,832,506 B2 | 9/2014 | Griffin et al. | |
| 8,862,818 B1 | 10/2014 | Ozdemir | |
| 8,880,838 B2* | 11/2014 | Kaiser | G06F 17/30581 711/162 |
| 8,984,216 B2 | 3/2015 | Fillingim | |
| 9,043,668 B2* | 5/2015 | Goss | G06F 11/1048 714/755 |
| 9,063,844 B2* | 6/2015 | Higgins | G06F 12/0246 |
| 9,069,468 B2* | 6/2015 | Mehra | G06F 3/0605 |
| 9,116,401 B2* | 8/2015 | Kim | G02F 1/1345 |
| 2002/0056025 A1 | 5/2002 | Qiu et al. | |
| 2002/0156891 A1 | 10/2002 | Ulrich et al. | |
| 2002/0159285 A1 | 10/2002 | Morley et al. | |
| 2003/0033308 A1 | 2/2003 | Patel et al. | |
| 2003/0046603 A1 | 3/2003 | Harari et al. | |
| 2003/0074592 A1 | 4/2003 | Hasegawa | |
| 2003/0163633 A1 | 8/2003 | Aasheim et al. | |
| 2004/0080985 A1 | 4/2004 | Chang et al. | |
| 2004/0088511 A1 | 5/2004 | Bacon et al. | |
| 2004/0252670 A1 | 12/2004 | Rong et al. | |
| 2005/0021904 A1 | 1/2005 | Iaculo et al. | |
| 2005/0038792 A1 | 2/2005 | Johnson | |
| 2005/0073884 A1 | 4/2005 | Gonzalez et al. | |
| 2005/0076102 A1 | 4/2005 | Chen et al. | |
| 2005/0144516 A1 | 6/2005 | Gonzalez et al. | |
| 2006/0015683 A1 | 1/2006 | Ashmore et al. | |
| 2006/0020745 A1 | 1/2006 | Conley et al. | |
| 2006/0022054 A1 | 2/2006 | Elhamias et al. | |
| 2006/0080505 A1 | 4/2006 | Arai et al. | |
| 2006/0136682 A1 | 6/2006 | Haridas et al. | |
| 2006/0143365 A1 | 6/2006 | Kikuchi | |
| 2006/0143475 A1 | 6/2006 | Herbert et al. | |
| 2006/0253641 A1 | 11/2006 | Gatzemeier et al. | |
| 2006/0256624 A1 | 11/2006 | Eggleston et al. | |
| 2006/0282644 A1 | 12/2006 | Wong | |

(56) References Cited

U.S. PATENT DOCUMENTS

| | | |
|---|---|---|
| 2006/0294574 A1 | 12/2006 | Cha |
| 2007/0050536 A1 | 3/2007 | Kolokowsky |
| 2007/0061511 A1 | 3/2007 | Faber |
| 2007/0067598 A1 | 3/2007 | Fujimoto |
| 2007/0079152 A1 | 4/2007 | Winick et al. |
| 2007/0083779 A1 | 4/2007 | Misaka et al. |
| 2007/0226592 A1 | 9/2007 | Radke |
| 2007/0234004 A1 | 10/2007 | Oshima et al. |
| 2007/0260811 A1 | 11/2007 | Merry, Jr. et al. |
| 2007/0263444 A1 | 11/2007 | Gorobets et al. |
| 2007/0276973 A1 | 11/2007 | Tan et al. |
| 2008/0028246 A1 | 1/2008 | Witham |
| 2008/0046630 A1 | 2/2008 | Lasser |
| 2008/0052446 A1 | 2/2008 | Lasser et al. |
| 2008/0082736 A1 | 4/2008 | Chow et al. |
| 2008/0126720 A1 | 5/2008 | Danilak |
| 2008/0183918 A1 | 7/2008 | Dhokia et al. |
| 2008/0189588 A1 | 8/2008 | Tanaka et al. |
| 2008/0263289 A1 | 10/2008 | Hosoya et al. |
| 2008/0313505 A1 | 12/2008 | Lee et al. |
| 2009/0006900 A1 | 1/2009 | Lastras-Montano et al. |
| 2009/0019321 A1 | 1/2009 | Radke |
| 2009/0070651 A1 | 3/2009 | Diggs et al. |
| 2009/0083587 A1 | 3/2009 | Ng et al. |
| 2009/0089485 A1 | 4/2009 | Yeh |
| 2009/0091990 A1 | 4/2009 | Park et al. |
| 2009/0109786 A1 | 4/2009 | Ye et al. |
| 2009/0125670 A1 | 5/2009 | Keays |
| 2009/0132756 A1 | 5/2009 | Hsieh |
| 2009/0138654 A1 | 5/2009 | Sutardja |
| 2009/0146721 A1 | 6/2009 | Kurooka et al. |
| 2009/0157948 A1 | 6/2009 | Trichina et al. |
| 2009/0164702 A1 | 6/2009 | Kern |
| 2009/0164710 A1 | 6/2009 | Choi et al. |
| 2009/0172248 A1* | 7/2009 | You ................ G06F 12/0246 711/103 |
| 2009/0172262 A1 | 7/2009 | Olbrich et al. |
| 2009/0179707 A1 | 7/2009 | Higashino |
| 2009/0183183 A1 | 7/2009 | Muppirala et al. |
| 2009/0228634 A1 | 9/2009 | Nakamura et al. |
| 2009/0228761 A1 | 9/2009 | Perlmutter et al. |
| 2009/0259819 A1 | 10/2009 | Chen et al. |
| 2009/0259896 A1 | 10/2009 | Hsu et al. |
| 2009/0271562 A1 | 10/2009 | Sinclair |
| 2009/0287975 A1 | 11/2009 | Kim et al. |
| 2009/0300238 A1 | 12/2009 | Panabaker et al. |
| 2009/0323419 A1 | 12/2009 | Lee et al. |
| 2009/0327581 A1 | 12/2009 | Coulson |
| 2009/0327591 A1 | 12/2009 | Moshayedi |
| 2010/0017650 A1 | 1/2010 | Chin et al. |
| 2010/0023674 A1 | 1/2010 | Aviles |
| 2010/0050053 A1 | 2/2010 | Wilson et al. |
| 2010/0082890 A1 | 4/2010 | Heo et al. |
| 2010/0122019 A1 | 5/2010 | Flynn et al. |
| 2010/0128537 A1 | 5/2010 | Suhail et al. |
| 2010/0138592 A1 | 6/2010 | Cheon |
| 2010/0165689 A1 | 7/2010 | Rotbard et al. |
| 2010/0169541 A1 | 7/2010 | Freikorn |
| 2010/0172179 A1 | 7/2010 | Gorobets et al. |
| 2010/0174845 A1 | 7/2010 | Gorobets et al. |
| 2010/0217898 A1 | 8/2010 | Priborsky et al. |
| 2010/0217915 A1 | 8/2010 | O'Connor et al. |
| 2010/0223531 A1 | 9/2010 | Fukutomi et al. |
| 2010/0228928 A1 | 9/2010 | Asnaashari et al. |
| 2010/0262792 A1 | 10/2010 | Hetzler et al. |
| 2010/0262795 A1 | 10/2010 | Hetzler et al. |
| 2010/0262875 A1 | 10/2010 | Hetzler et al. |
| 2010/0287328 A1 | 11/2010 | Feldman et al. |
| 2010/0293367 A1 | 11/2010 | Berke et al. |
| 2010/0312954 A1 | 12/2010 | Jeon et al. |
| 2010/0318719 A1 | 12/2010 | Keays et al. |
| 2010/0325340 A1 | 12/2010 | Feldman et al. |
| 2010/0332726 A1 | 12/2010 | Wang |
| 2011/0002224 A1 | 1/2011 | Tamura |
| 2011/0016239 A1 | 1/2011 | Stenfort |
| 2011/0055455 A1 | 3/2011 | Post et al. |
| 2011/0055468 A1 | 3/2011 | Gonzalez et al. |
| 2011/0066788 A1 | 3/2011 | Eleftheriou et al. |
| 2011/0072423 A1 | 3/2011 | Fukata |
| 2011/0078393 A1 | 3/2011 | Lin |
| 2011/0099342 A1 | 4/2011 | Ozdemir |
| 2011/0107144 A1 | 5/2011 | Ohara |
| 2011/0131365 A1 | 6/2011 | Zhang et al. |
| 2011/0131447 A1 | 6/2011 | Prakash et al. |
| 2011/0132000 A1 | 6/2011 | Deane et al. |
| 2011/0138100 A1 | 6/2011 | Sinclair |
| 2011/0145473 A1 | 6/2011 | Maheshwari |
| 2011/0161775 A1 | 6/2011 | Weingarten |
| 2011/0190963 A1 | 8/2011 | Glassl et al. |
| 2011/0191522 A1 | 8/2011 | Condict et al. |
| 2011/0191649 A1 | 8/2011 | Lim et al. |
| 2011/0209032 A1 | 8/2011 | Choi et al. |
| 2011/0238892 A1 | 9/2011 | Tsai et al. |
| 2011/0239088 A1 | 9/2011 | Post |
| 2011/0258496 A1 | 10/2011 | Tseng et al. |
| 2011/0314219 A1 | 12/2011 | Ulrich et al. |
| 2011/0320687 A1 | 12/2011 | Belluomini et al. |
| 2012/0008401 A1 | 1/2012 | Katz et al. |
| 2012/0011336 A1 | 1/2012 | Saika |
| 2012/0023144 A1 | 1/2012 | Rub |
| 2012/0047318 A1 | 2/2012 | Yoon et al. |
| 2012/0047320 A1 | 2/2012 | Yoo et al. |
| 2012/0047409 A1 | 2/2012 | Post et al. |
| 2012/0066450 A1 | 3/2012 | Yochai et al. |
| 2012/0079348 A1 | 3/2012 | Naeimi |
| 2012/0079355 A1 | 3/2012 | Patapoutian et al. |
| 2012/0096217 A1 | 4/2012 | Son et al. |
| 2012/0124046 A1 | 5/2012 | Provenzano |
| 2012/0124273 A1 | 5/2012 | Goss et al. |
| 2012/0151260 A1 | 6/2012 | Zimmermann et al. |
| 2012/0170365 A1 | 7/2012 | Kang et al. |
| 2012/0185706 A1 | 7/2012 | Sistla et al. |
| 2012/0213004 A1 | 8/2012 | Yun et al. |
| 2012/0216085 A1 | 8/2012 | Weingarten et al. |
| 2012/0236656 A1 | 9/2012 | Cometti |
| 2012/0239858 A1 | 9/2012 | Melik-Martirosian |
| 2012/0254686 A1 | 10/2012 | Esumi et al. |
| 2012/0266011 A1 | 10/2012 | Storer et al. |
| 2012/0266048 A1 | 10/2012 | Chung et al. |
| 2012/0278530 A1 | 11/2012 | Ebsen |
| 2012/0278531 A1 | 11/2012 | Horn |
| 2012/0284587 A1 | 11/2012 | Yu et al. |
| 2012/0297113 A1 | 11/2012 | Belluomini et al. |
| 2012/0311402 A1 | 12/2012 | Tseng et al. |
| 2012/0317334 A1 | 12/2012 | Suzuki et al. |
| 2012/0324191 A1 | 12/2012 | Strange et al. |
| 2012/0331207 A1 | 12/2012 | Lassa et al. |
| 2013/0007380 A1 | 1/2013 | Seekins et al. |
| 2013/0007543 A1 | 1/2013 | Goss et al. |
| 2013/0054881 A1 | 2/2013 | Ellis et al. |
| 2013/0060994 A1 | 3/2013 | Higgins et al. |
| 2013/0061019 A1 | 3/2013 | Fitzpatrick et al. |
| 2013/0073788 A1 | 3/2013 | Post et al. |
| 2013/0073797 A1 | 3/2013 | Chowdhury |
| 2013/0074093 A1 | 3/2013 | Gounares et al. |
| 2013/0080691 A1 | 3/2013 | Weingarten et al. |
| 2013/0094289 A1 | 4/2013 | Sridharan et al. |
| 2013/0100600 A1 | 4/2013 | Yin et al. |
| 2013/0104005 A1 | 4/2013 | Weingarten et al. |
| 2013/0124792 A1 | 5/2013 | Melik-Martirosian et al. |
| 2013/0151753 A1 | 6/2013 | Jeon et al. |
| 2013/0198436 A1 | 8/2013 | Bandic et al. |
| 2013/0205102 A1* | 8/2013 | Jones ................ G06F 13/1684 711/154 |
| 2013/0232290 A1 | 9/2013 | Ish et al. |
| 2013/0238833 A1 | 9/2013 | Vogan et al. |
| 2013/0265825 A1 | 10/2013 | Lassa |
| 2013/0304998 A1 | 11/2013 | Palmer |
| 2013/0326116 A1 | 12/2013 | Goss et al. |
| 2013/0332791 A1 | 12/2013 | Chu |
| 2014/0036589 A1 | 2/2014 | Parthasarathy et al. |
| 2014/0059359 A1 | 2/2014 | Bahirat |
| 2014/0108891 A1 | 4/2014 | Strasser et al. |
| 2014/0129874 A1 | 5/2014 | Zaltsman et al. |

(56) References Cited

U.S. PATENT DOCUMENTS

| | | |
|---|---|---|
| 2014/0158525 A1 | 6/2014 | Greene |
| 2014/0181370 A1 | 6/2014 | Cohen et al. |
| 2014/0208174 A1 | 7/2014 | Ellis et al. |
| 2014/0258769 A1 | 9/2014 | Baryudin et al. |
| 2014/0372777 A1 | 12/2014 | Reller et al. |

FOREIGN PATENT DOCUMENTS

| | | |
|---|---|---|
| EP | 2 498 259 A2 | 9/2012 |
| JP | 2012129859 A | 7/2012 |
| WO | WO 2009/042298 A1 | 4/2009 |
| WO | WO 2011/156466 A2 | 12/2011 |

OTHER PUBLICATIONS

International Search Report and Written Opinion dated Oct. 17, 2014, received in International Patent Application No. PCT/US2014/049734, which corresponds to U.S. Appl. No. 14/332,259, 8 pages (Higgins).

International Search Report and Written Opinion dated Oct. 23, 2014, received in International Patent Application No. PCT/US2014/049736, which corresponds to U.S. Appl. No. 14/446,249 8 pages (Fitzpatrick).

International Search Report and Written Opinion dated Nov. 5, 2014, received in International Patent Application No. PCT/US2014/049282, which corresponds to U.S. Appl. No. 13/957,407,12 pages (Fitzpatrick).

Narayanan et al., "Migrating Server Storage to SSDs: Analysis of Tradeoffs," Computer Systems, Apr. 2009, 12 pages.

Shiraz et al., "Block Aging Prevention Technique (BAP) for Flash Based Solid State Disks," 7th International Conference on Emerging Technologies (ICET), Sep. 5, 2011, 6 pages.

Tai et al, "Prolongation of Lifetime and the Evaluation Method of Dependable SSD," 25 International Symposium on Defect and Fault Tolerance in VLSI Systems, 2010, NJ, USA, 8 pages.

Tseng et al., "Understanding the Impact of Power Loss on Flash Memory," DAC'11, Jun. 5-10, 2011, San Diego, California, 6 pages.

Yimo et al., "WeLe-RAID: A SSD-Based RAID for System Endurance and Performance," Jan. 2011, Network and Parallel Computing, Springer, 14 pages.

International Search Report and Written Opinion dated Feb. 18, 2015, received in International Patent Appiication No. PCT/US2014/065401, which corresponds to U.S. Appl. No. 14/082,031, 9 pages (Higgins).

International Search Report dated Apr. 15, 2014, received in International Patent Application No. PCT/US2013/078340, which corresponds to U.S. Appl. No. 13/746,542, 11 pages (Ellis).

Cooke, "Introduction to Flash Memory (T1A)," Flash Memory Summit, Aug. 22, 2008, Micron Technology, Inc., 102 pages.

Gal et al., "Algotithms and Data Structures for Flash Memories," ACM Computing Surveys, Jun. 2005, vol. 37, No. 2, 30 pages.

IBM Corporation, "Systems Management, Work Management," Version 5, Release 4, 9th Edition, Feb. 2006, pp. 1-21.

O'Brien, "SMART Storage Systems Optimus SAS Enterprise SSD Review," SMART Storage Systems, Oct. 9, 2012, 44 pages.

Spanjer, "Flash Management—Why and How?" Smart Modular Technologies, Nov. 2009, http://www.scantec.de/fileadmin/pdf/Smart_Modular/Flash-Management.pdf, 14 pages.

Texas Instruments, "Power Management IC for Digital Set Top Boxes," SLVSA10A, Sep. 2009, pp. 1-22.

International Search Report and Written Opinion dated Dec. 20, 2013, received in PCT/US2013/045282, which corresponds to U.S. Appl. No. 13/493,949, 7 pages (Ellis).

International Search Report and Written Opinion dated Jun. 12, 2014, received in PCT/US2014/018972, which corresponds to U.S. Appl. No. 13/779,352, 12 pages (Schmier).

International Search Report and Written Opinion dated May 14, 2014, received in International Patent Application No. PCT/US2014/017168, which corresponds to U.S. Appl. No. 14/076,115, 6 pages (Fitzpatrick).

International Search Report and Written Opinion dated May 14, 2014, received in International Patent Application No. PCT/US2014/017169, which corresponds to U.S. Appl. No. 14/076,148, 6 pages (Fitzpatrick).

Ulinktech, "ATA Command Table (in Alphabetic Order)," Feb. 6, 2011, https://web.archive.org/web/20110206060820/http://www.ulinktech.com/downloads/AT, 6 pages.

Internationai Search Report and Written Opinion dated Aug. 22. 2014, received in International Patent Application No. PCT/US2014/032978, which corresponds to U.S. Appl. No. 14/081,992, 10 pages (Ellis).

International Search Report dated Mar. 25, 2014, received in International Patent Application No. PCT/US2013/072400, which corresponds to U.S. Appl. No. 13/690,337, 3 pages (Ellis).

Invitation to Pay Additional Fees dated Jul. 25, 2014, received in International Patent Application No. PCT/US2014/021290, which corresponds to U.S. Appl. No. 13/791,797, 8 pages (Dean).

International Search Report and Written Opinion dated Jul. 31, 2014, received in International Patent Application No. PCT/US2014/031465, which corresponds to U.S. Appl. No. 13/851,928, 13 pages (Ellis).

International Search Report and Written Opinion dated Jul. 31, 2014, received in International Patent Application No. PCT/US2014/033876, which corresponds to U.S. Appl. No. 13/861,326, 9 pages (Fitzpatrick).

International Search Report and Written Opinion dated Jan. 9. 2015, received in International Patent Application No. PCT/US2014/049731, which corresponds to U.S. Appl. No. 14/334,324, 9 pages (Fitzpatrick).

Online Merriam Webster Dictionary, definition of "Distinct" from Jun. 12, 2011, https://web.archive.org/web/20110612181129/http://www2.merriam-webster.com/cgi-bin/mwdictadu?book=Dictionary&va=distinct.

\* cited by examiner

DATA STORAGE SYSTEM WITH DYNAMIC ERASE BLOCK GROUPING MECHANISM AND METHOD OF OPERATION THEREOF

RELATED APPLICATION

This application claims priority to U.S. Provisional Patent Application Ser. No. 61/863,419, filed Aug. 7, 2013, entitled "Data Storage System with Dynamic Erase Block Grouping Mechanism and Method of Operation Thereof," which is hereby incorporated by reference in its entirety.

TECHNICAL FIELD

The present invention relates generally to a data storage system and more particularly to a system with a dynamic erase block grouping mechanism.

BACKGROUND

Data storage, often called storage or memory, refers to computer components and recording media that retain digital data. Data storage is a core function and fundamental component of consumer and industrial electronics, especially devices such as computers, televisions, cellular phones, mobile devices, and digital video cameras.

Recently, forms of long-term storage other than electromechanical hard disks have become feasible for use in computers. NOT-AND (NAND) flash is one form of non-volatile memory used in solid-state storage devices. The memory cells are arranged in typical row and column fashion with circuitry for accessing individual cells. The memory transistors of those cells are placed to store an analog value that can be interpreted to hold two logical states in the case of Single Level Cell (SLC) or more than two logical states in the case of Multi Level Cell (MLC).

A flash memory cell is light in weight, occupies very little space, and consumes less power than electromechanical disk drives. Construction of a storage system with this type of memory allows for much higher bandwidths and input/output operations per second (IOPS) than typical electromechanical disk drives. More importantly, it is especially rugged and can operate at a much high temperature range. It will withstand without adverse effects repeated drops, each of which would destroy a typical electromechanical hard disk drive. A problem exhibited by flash memory is that it tends to have a limited life in use.

Thus, a need still remains for better data management devices. In view of the increasing demand for data management devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DETAILED DESCRIPTION

Figure 1:
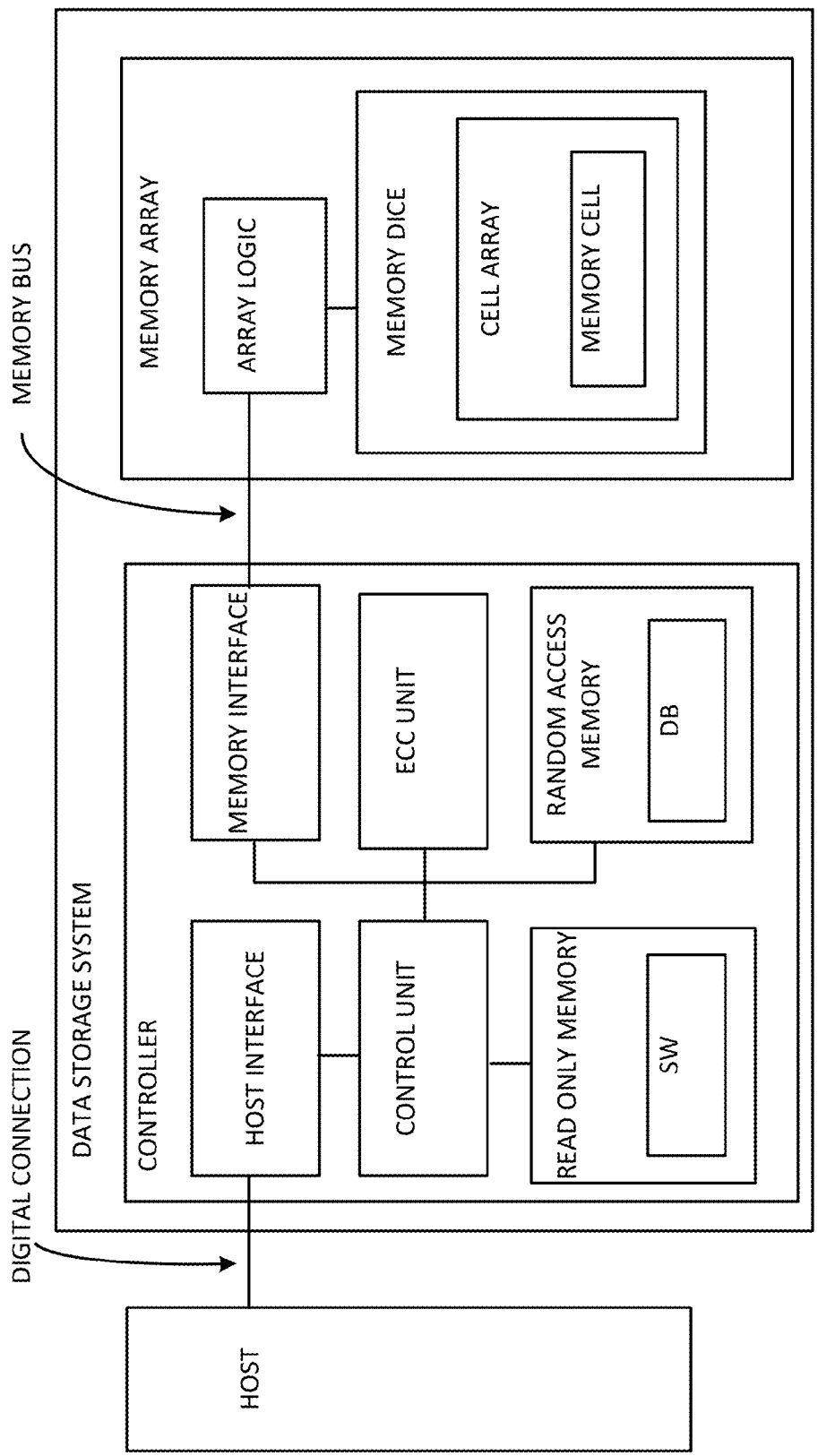
FIG. 1 is a block diagram of a data storage system in an embodiment of the present invention.

The various implementations described herein include systems, methods and/or devices used to enable dynamic erase block grouping. Some implementations include systems, methods and/or devices to select two or more unassociated erase blocks in accordance with characteristics of the unassociated erase blocks so as to select unassociated erase blocks with similar characteristics and group the two or more unassociated erase blocks with similar characteristics to form a super block.

More specifically, some embodiments include a method of operation of a data storage system. In some embodiments, the method includes (1) maintaining metadata for each erase block of a plurality of erase blocks in the data storage system, wherein a respective metadata for a respective erase block includes one or more characteristics of the respective erase block, (2) allocating a set of erase blocks, of the plurality of erase blocks, as unassociated erase blocks, (3) selecting two or more unassociated erase blocks in accordance with characteristics of the unassociated erase blocks so as to select unassociated erase blocks with similar characteristics, and (4) grouping the two or more unassociated erase blocks with similar characteristics to form a super block.

In some embodiments, the one or more characteristics of the respective erase block include at least one characteristic selected from the group consisting of age information, wear statistics, physical location, and operation parameters.

In some embodiments, the metadata is maintained in a persistent storage mechanism.

In some embodiments, the super block includes two or more unassociated erase blocks from different memory die of the data storage system.

In some embodiments, selecting two or more unassociated erase blocks in accordance with characteristics of the unassociated erase blocks so as to select unassociated erase blocks with similar characteristics includes selecting two or more unassociated erase blocks with similar ages.

In some embodiments, selecting two or more unassociated erase blocks in accordance with characteristics of the unassociated erase blocks so as to select unassociated erase blocks with similar characteristics includes (1) selecting a first unassociated erase block from a first die of the data storage system, (2) selecting a second unassociated erase block from a second die of the data storage system, and (3) forgoing selection of a third unassociated erase block from a third die of the data storage system, wherein the third die is relatively worn in comparison to the first die and second die.

In some embodiments, the method further includes (1) aggregating metadata from the two or more unassociated erase blocks of the super block, and (2) storing the aggregated metadata as metadata for the super block.

In some embodiments, the method further includes (1) selecting one or more erase blocks, in accordance with the one or more characteristics of the one or more erase blocks, for recycling, (2) recycling the selected one or more erase blocks, and (3) allocating the recycled one or more erase blocks as unassociated erase blocks.

In some embodiments, the method further includes selecting, from the super block, a relatively old erase block to store parity information.

In some embodiments, the method includes enforcing a minimum amount of dwell time for the unassociated erase blocks, wherein dwell time is the amount of time between operations on a respective erase block.

In another aspect, any of the methods described above are performed by a data storage system, the data storage system including (1) one or more processors, and (2) memory storing one or more programs to be executed by the one or more processors, the one or more programs comprising instructions for performing or controlling performance of any of the methods described herein.

In yet another aspect, some embodiments include a non-transitory computer readable storage medium, storing one or more programs configured for execution by one or more processors of a data storage system, the one or more programs including instructions for performing or controlling performance of any of the methods described herein.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

The term "module" referred to herein can include software, hardware, or a combination thereof in the present invention in accordance with the context in which the term is used. For example, the software can be machine code, firmware, embedded code, and application software. Also for example, the hardware can be circuitry, processor, computer, integrated circuit, integrated circuit cores, a microelectromechanical system (MEMS), passive devices, environmental sensors including temperature sensors, or a combination thereof.

The term "bit error rate" (BER) referred to herein is defined as a number of incorrect bits in a data stream stored in a memory device including NAND. The term "error correction code" referred to herein is defined as parity data generated over a set of data grouped into a code word.

The term "erase block" referred to herein is defined as a group of pages, which is the smallest number of pages that are erased at one time. The term "memory page" referred to herein is defined as a memory component within an erase block that is programmed as an individual unit. The memory page is a smallest group of data bytes that are read from or written to in an erase block.

The term "retention" referred to herein is defined as an ability of memory cells to retain the programmed or correct information. Retention refers to an amount of correct data after a given period, which is a time when a drive is powered, not powered, or a combination thereof. The term "program erase cycle" (PE cycle) referred to herein is defined as a base level operation of how data is replaced within an erase block. For example, a memory device including NAND and other memory types can have a limited number of useful PE cycles.

The term "age" referred to herein indicates how long a storage system or a memory component has existed or has been in operation. For example, the age can be based on a number of erase cycles, how long it has been since the last time an erase block was written, an average BER an erase block is yielding, a temperature at which a device has been run, or a combination thereof.

The term "recycling" or "recycle" referred to herein is defined as moving data from one flash page to another flash page, for the purposes of either freeing up erase blocks to write new host data, or to ensure that the data on the erase block is preserved. The term "endurance" referred to herein is defined as a number of operations a memory device including NAND flash device tolerates over a given period of operational life of a storage system including a solid-state disk drive (SSD).

The term "young erase block" referred to herein is defined as an erase block with a low age, either in absolute terms or relative to other erase blocks on the drive. The term "old erase block" referred to herein is defined as an erase block with a high age, either in absolute terms or relative to other erase blocks on the drive.

The term "dwell time" referred to herein is defined as the amount of time that an erase block experiences in between erase operations. The term "unassociated erase block" referred to herein is defined as an erase block that is not part of a larger grouping of erase blocks. An unassociated erase block is part of the spare pool.

Referring now to FIG. 1, therein is shown a block diagram of a data storage system in an embodiment of the present invention. The data storage system includes a memory array coupled to a controller via a memory bus.

The controller is a processing unit for managing the storage and retrieval of data in the memory array. The controller can be an embedded processor, control logic, or a combination thereof. The controller can transfer stored data from the memory array to a host device.

The memory array is a non-volatile memory unit for storing data. The memory array can include NAND flash memory arrays, NOR flash memory arrays, other non-volatile memory arrays, or a combination thereof.

The memory array can be formed with memory dice. The memory dice are semiconductor devices for storing information. The memory dice are the minimum unit that can independently execute commands and report status. For example, the memory dice can be flash memory devices, NAND flash memory chips, NOR flash memory devices, or a combination thereof.

The memory bus is a communication channel. The memory bus conveys data and control information between the controller and the memory array.

The memory dice can include a cell array. The cell array is a set of non-volatile flash memory cells for storing data. For example, the cell array can include a single-level cell flash memory, a multi-level cell flash memory, a mixed functionality cell, or a combination thereof.

The cell array can include memory cells. The memory cells are electronic structures for storing information. For example, the memory cells can be floating gate flash memory devices.

The memory array can include an array logic unit coupled to the cell array. The array logic unit is circuitry to provide addressing, data transfer and sensing, and other support to control the memory array for saving and retrieving information from the cell array.

The controller can include a memory interface coupled to the memory array. The memory interface can include circuitry for communicating with the memory array over the memory bus.

The controller can include a control unit coupled to the memory interface and a host interface. A read only memory can be coupled to the control unit. A random access memory can be coupled to the control unit and to the read only memory. The random access memory can be utilized as a buffer memory for temporary storage of data being written to or read from the memory array.

The random access memory can include a controller database. The controller database is a data storage and retrieval system. The controller database can store information about the data storage system.

The read only memory can include a software for operating the control unit. The software is executable code for implementing the intelligence of the data storage system.

The controller can include an error correction code unit coupled to the control unit. The error correction code unit is a processing hardware for calculating an error correction code value that can be used to detect errors, correct errors, or a combination thereof in data stored or transmitted from the memory array.

The error correction code unit can calculate one or more error correction code values using different methods such as a Reed-Solomon code, a Hamming code, a Bose-Chauduri-Hocquenghem (BCH) code, or a combination thereof. Although the error correction code unit is a dedicated element for calculating error correction codes, it is understood that error correction codes can also be calculated in other ways, such as using the control unit to calculate error correction codes.

The controller can include the host interface coupled to the host device via a digital connection. The host device is a computing device that can use the data storage system for storing data. For example, the host device can be a laptop computer, a desktop computer, a server, a smart phone, or a combination thereof.

The host interface can communicate commands and data between the host device and the controller with the digital connection. For example, the host interface can detect a connection to the host device and generate command based on the connection to the host device.

The data storage system can be connected to the host device with the digital connection. The digital connection is a communication link for transferring digital information between the data storage system and the host device.

The digital connection can be formed in a variety of ways. For example, the digital connection can be a universal serial bus (USB) connection for transferring information. In another example, the digital connection can be a wireless communication mechanism, such as Wireless Fidelity (Wi-Fi), infrared communication mechanism, optical communication system, near field communication system, or a combination thereof.

Figure 2:
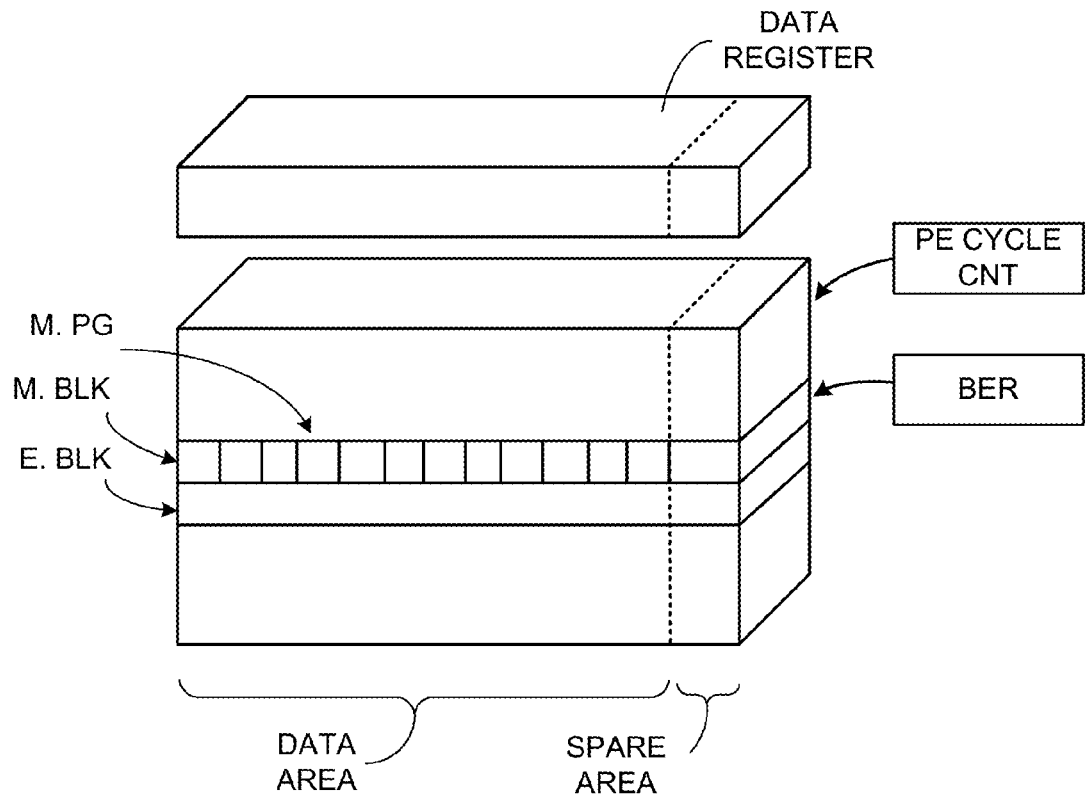
FIG. 2 is an example of a memory diagram of the data storage system.

Referring now to FIG. 2, therein is shown an example of a memory diagram of the data storage system of FIG. 1. The memory diagram shows the data storage system including memory pages, memory blocks, and a data register. The data storage system can be formed using the memory dice of FIG. 1. The memory dice include the memory cells of FIG. 1 for storing data.

The data storage system can have a variety of storage capacities determined by the number of the memory dice used to form the data storage system. For example, the data storage system can include 2 gigabytes (GB) of flash memory, 8 GB, 16 GB, or other memory sizes.

The data storage system can include a number of the memory blocks. The memory blocks are portions of the memory array of FIG. 1. For example, the data storage system with capacity of 2 GB can have 4,096 of the memory blocks.

The memory blocks can include erase blocks. The erase blocks are the smallest unit of memory that can be erased as a single entity at one time.

Each of the erase blocks can have a program erase cycle count. When one of the erase blocks is erased, then the program erase cycle count can be incremented. The program erase cycle count can represent the age or level of wear of one of the memory blocks. The program erase cycle count is a measure of the level of usage within one of the erase blocks. The flash memory devices, such as NAND flash, have a limited number of useful program erase cycles.

The memory blocks can be divided into the memory pages. The memory pages are the smallest group of data bytes that can be read or written in the data storage system. The memory pages are the smallest addressable unit of memory that can be programmed. For example, each of the memory blocks can have 64 of the memory pages.

The memory pages include a data area and a spare area. The data area is a group of memory cells used to store user data. The data area can be various sizes. For example, the data area of one of the memory pages can be bytes.

The spare area is a group of memory cells to store metadata about the data area. For example, the spare area can include error correction code information, status information, or a combination thereof. The spare area can have a variety of sizes. For example, the spare area can be bytes. The memory pages can have a size of bytes for the data area and the spare area.

The memory array of FIG. 1 can be updated by erasing the memory blocks and programming new data into the memory blocks that have been erased. Programming the memory blocks writes data into the memory blocks.

Reading one of the memory pages can result in reading errors where one or more of the bits in the memory pages are incorrect. The number of individual bit errors in a stream of data is described as a bit error rate. The bit error rate is defined as numbers of incorrect bits in a data stream stored in the data storage system. The incorrect bits can be detected within a code word protected by an error-correcting code.

The code word refers to a group of data bytes covered by a single instance of multiple ECC parity words. The error-correcting code refers to parity or redundant data generated over a set of host or user data grouped into the code word.

The bit error rate is the number of incorrect bits in a data stream stored in the flash memory.

The data storage system can be divided into two physical planes. The planes can include all odd numbered blocks and all even numbered blocks, respectively. Configuring the data storage system into multiples of the planes can allow concurrent access to each plane to increase performance. With the data storage system configured with two of the planes, the data storage system can perform two concurrent reads, perform two concurrent erase operations, program two pages concurrently, or a combination thereof. Each individual operation can be performed on the memory blocks of one of the planes. The data storage system is described with two of the planes, but it is understood that more than two planes can be configured.

Figure 3:
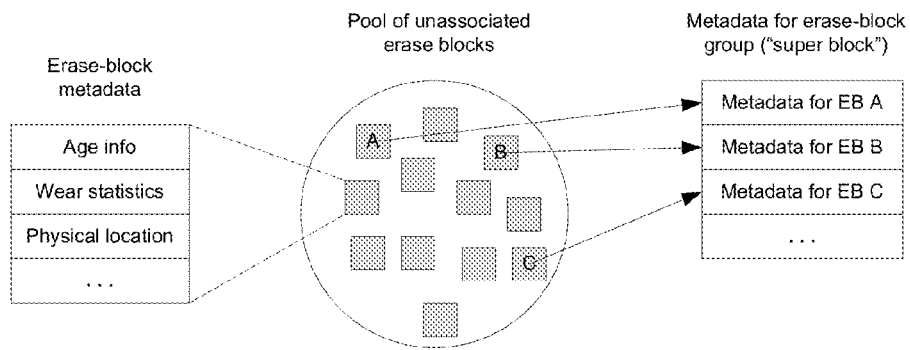
FIG. 3 is an example of a super block configuration.

Referring now to FIG. 3, therein is shown an example of a super block configuration. The super blocks can be formed from a pool of the erase blocks that are unassociated with other ones of the erase blocks. The data storage system can operate on one of the super blocks as a unit.

The pool of the unassociated erase blocks can form one of the super blocks. Each of the erase blocks in the pool of unassociated erase blocks can have erase block metadata including age information, wear statistics, physical location, operation parameters, or a combination thereof. The individual erase block metadata is aggregated when the data storage system creates one of the super blocks and the super block metadata.

The data storage system maintains an erase block pools for the unassociated erase blocks for each of the memory dice or each of the planes within one of the memory dice. The erase block pool can be sorted by an important metric, such as age. This allows an erase block selector to construct the super blocks that will improve the wear leveling on the data storage system. The erase block selector is a module having the intelligence to create each of the super blocks based on a set of rules and criteria.

The data storage system must leave some of the erase blocks empty in a spare pool, so it has space to write new and recycled data and the erase block metadata. The erase block pool is a group of the erase blocks that are unassociated with other of the erase blocks. By keeping some of the erase blocks unassociated, the data storage system can choose when and how to group them together.

The erase block metadata can be stored in the controller database. The erase block metadata can include information for every one of the erase blocks in the drive, including the unassociated erase blocks. The erase block metadata can include the erase block age for each of the erase blocks.

For the erase blocks in the unassociated list, the erase block metadata is kept in non-volatile memory. For example, the erase block metadata for unassociated erase blocks can be stored in an area of volatile memory that can be guaranteed to commit to NAND memory upon detection of a power loss event. When the erase blocks are grouped together into one of the super blocks, the erase block metadata is aggregated for one of the super blocks and written out to the super blocks as the super block metadata.

Figure 4:
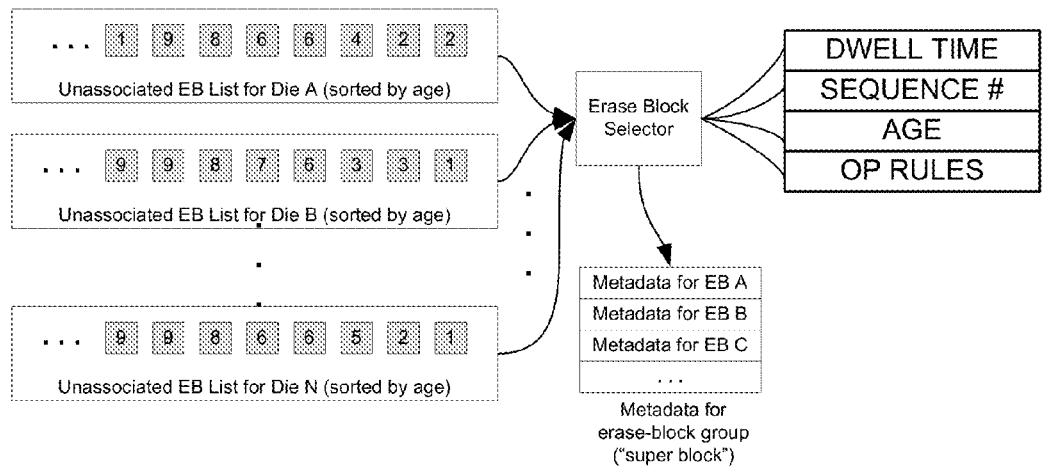
FIG. 4 is an example of the erase block selector module.

Referring now to FIG. 4, therein is shown an example of the erase block selector module. The erase block selector can create the super blocks from the unassociated pool of the erase blocks.

The erase block selector can use lists of unassociated erase blocks lists sorted by the age of the erase blocks to construct the super blocks using erase blocks from different one of the memory dice. For example, the age of one of the erase blocks is a number having an increasing value for indicating higher wear.

The erase block selector can configure the erase blocks to improve the life of the drive by creating the super blocks. Grouping the erase blocks into the super blocks can reduce the amount of data required to manage the data storage system and improve performance. The erase block selector can aggregate the erase block metadata to form the super block metadata.

It has been found that by providing the erase block selector with information on the age of each of the unassociated erase blocks can allow the erase block selector to improve the lifespan of the data storage system by using "per-erase block age metadata" and the notion of unassociated erase blocks when forming the super blocks. The erase block selector can reduce overall wear, minimize data traffic, and increase performance of the data storage system by optimizing the configuration of the super blocks.

The erase block selector can optimize the configuration of the super blocks in a variety of ways. The erase block selector can configure the super blocks by grouping the erase blocks having similar values for the age, selecting the erase blocks having the youngest age together, forming the super blocks based on the roles of the erase blocks, configuring the super blocks based on the dwell time, configuring the data storage system to support multiple concurrent operations, selecting the erase blocks based on the physical topology of the memory dice, or a combination thereof.

The erase block selector can form groups of the erase blocks having similar values of the erase block age. This allows the data storage system to make further wear-leveling decisions for each of the super blocks to improve the life of the data storage system.

The data storage system can measure different types of age in a variety of ways. For example, the super block age can be the average age of the erase blocks of one of the super blocks. In another example, the memory dice age can be average or maximum age of the erase blocks for one of the memory dice. In yet another example, the drive age can be the average or maximum age of the erase blocks of the data storage system.

The memory element age can have varying impacts on the performance of the data storage system. For example, one of the super blocks having mostly the erase blocks have low values for the age should get more of the program erase cycles applied to it than another of the super blocks having mostly the erase blocks having larger values for the age. Using young erase blocks can increase the overall effective life of the data storage system.

The erase block age indicates the level of wear for one of the erase blocks. The erase block age can be based on a number of program erase cycles, how long it has been since the last time an erase block was written, an average values of a bit error rate one of the erase blocks is yielding, a temperature at which a device has been run, or a combination thereof.

Similarity is a measure of how close two or more of the erase blocks are in terms of a measuring parameter. For example, two or more of the erase blocks can be similar if the age of each of the erase blocks is within an age range threshold of one another. The age measurement can be any of a variety of data types as shown above.

In another example, similarity can be based on categorizing some of the erase blocks, such as grouping the erase blocks having the lowest 16 values of the erase block age. In yet another example, the erase blocks can be grouped by similarity if the age of each of the erase blocks is within a certain percentage of one another, such as with 20% of one another. In another example, the erase blocks can be grouped by similarity if the bit error rate of each of the erase blocks is within a threshold value of one another.

During the formation of one of the super blocks, the data storage system can try to completely fill the super blocks with the erase blocks that fulfill the criteria. However, it is understood that one of the super blocks can be formed with a different number of the erase blocks if an insufficient number of the erase blocks are similar to one another. The super blocks can be formed by combining some of the erase blocks using different criteria.

The erase block selector can allocate the erase blocks having the lowest values for the age first, while allocating the erase blocks having larger values for the age remain in the unassociated pools for a longer time. By evenly distributing wear by applying more write operations to the erase blocks having a lower value for the age, the erase blocks with a higher value for age can be spared from excessive write operations.

The super blocks can be homogenous by having all of the erase blocks having similar criteria. However, it is understood that the super blocks can be heterogeneous by having some of the erase blocks in one of the super blocks with different criteria that are not similar. For example, one of the erase blocks can have a higher value for the age than some of the other ones of the erase blocks.

The erase block selector can allocate some of the erase blocks to one of the super blocks based on roles. The roles are a type of usage descriptor for the erase blocks.

The data storage system can include a variety of the roles. For example, the roles can include parity blocks, error correction code blocks, host data blocks, metadata blocks, a priori types, hot usage, cold usage, frequency, or a combination thereof. The roles can be based on relative or absolute ages.

The erase blocks of one of the super blocks can be homogenous and have similar types of the roles. However, it is understood that the erase blocks of one of the super blocks can be heterogeneous and have different types of the roles. For example, the super blocks can include some of the erase blocks having host data roles and parity roles.

For example, if the super blocks include parity protection, the erase block selector may choose a relatively old one of the erase blocks to store the parity information, since the parity information is accessed infrequently and thus would suffer few read-disturb errors or read retries. The erase block selector can ensure that the erase blocks that are unassociated are given additional amount of the dwell time that they each need to store data reliably once they are written.

Dwell time is the amount of time between operations on one of the erase blocks. Dwell time can be the amount of time between erase operations. It has been discovered that enforcing a minimum amount of the dwell time can reduce the bit error rate for reading one of the erase blocks by allowing the insulators of the floating gates forming the flash memory cells to heal between operations.

The minimum amount of the dwell time can vary based on the technology used to fabricate the memory dice. Each different flash technology and generation can have different requirements for the dwell time. The minimum value for the dwell time having the optimal results can be determined experimentally, by computer analysis, be provided by the manufacturer of the flash memory, be calculated, be estimated, or a combination thereof. Although timing flash memory operations for the minimum value of the dwell time can increase performance, it is understood that maximizing the value of the dwell time can increase performance and reduce the bit error rate for one of the erase blocks.

The dwell time can be determined in a variety of ways. For example, the dwell time can be estimated using a sequence number of one of the erase blocks. The sequence number can be a value indicating when one of the erase blocks was last accessed. The sequence number can be relative or absolute. For example, the sequence number for each of the erase blocks can be an incremented number for each serial operation performed on the erase blocks. The sequence number can indicate the order in which the erase blocks have been written.

The scope of the dwell time can be determined in a variety of ways. For example, the dwell time can be determined for each of the erase blocks, each of the super blocks, or a combination thereof. The dwell time of the super blocks can be based on the individual values of the dwell time for the erase blocks.

It has been discovered that letting the erase blocks have longer amount of the dwell time will improve their age characteristics, especially on worn flash memory dice. Thus, enforcing minimum amount of the dwell time and allowing the oldest of the erase blocks more of the dwell time will make the SSD last longer.

For some flash memory, there is a benefit to doing operations on multiple erase blocks within the memory dice at one time. For example, the memory dice may allow the data storage system to erase or program two of the erase blocks simultaneously if certain operational rules are satisfied.

The erase block selector can allocate the erase blocks to one of the super blocks to ensure that one of the super blocks is constructed to allow for these multiple-erase block operations. The super blocks can be configured to reside on a set of mutually exclusive memory dice to support multiple simultaneous operations.

For example, one of the super blocks can be configured to use the memory dice identified as units 0-7, which another of the super blocks can be configured to use the memory dice 8-15. Because the super blocks operate on mutually exclusive memory dice, two memory operations can be performed simultaneously without interference. In an illustrative example, the data storage system can erase one of the super blocks at the same time as writing information to another of the super blocks.

It has been discovered that configuring the super blocks to have mutually exclusive memory dice configurations can increase write performance by allowing multiple simultaneous write operations.

In another example, the super blocks can be configured horizontally across a number of channels in the flash memory device to increase performance. However, it is understood that the super blocks can be configured vertically with all of the erase blocks in one the channels.

The operational rules can be sets of conditions required for performing certain operations. For example, the operational rules can permit multiple write operations based on the configuration of the erase blocks in the super blocks. In another example, the operational rules can prevent multiple operations based on the configuration of the erase blocks.

The operational rules can be provided at a product level, as part of manufacturer level data, on a component level, or a combination thereof. The operational rules can be dynamic and change over time. The operational rules can be based on state information for the memory blocks, memory pages, the erase blocks, the super blocks, or groups of the super blocks.

The erase block selector can select some of the erase blocks based on the physical flash topology, in order to allow for more parallel operations. For example, the erase blocks for the super blocks can be selected to have mutually exclusive physical locations on different ones of the memory dice.

It has been discovered that configuring the erase blocks of the super blocks based on the physical location of the erase blocks can support protection from memory plane failure or memory die failure by using parity protection. The erase blocks can be configured based on a redundant array of inexpensive drives level zero (RAID-0) or RAID level one (RAID-1) depending on need. For example, the erase blocks of the super blocks can be arranged in a RAID-0 or a RAID-1 configuration for data recovery and performance.

Different configurations of striping and mirroring can be used to configure the erase blocks of the super blocks based on desired performance and data safety criteria. Such configuration can support the recovery of data due to the failure of one of the data planes, one of the memory dice, one of the erase blocks, a parity block, or a combination thereof. For example, the erase blocks of one of the super blocks can be configured in a 31:1 data parity ratio to protect 31 of the erase blocks having host data with one of the erase blocks having parity information for data recovery.

It has been found that an important aspect of this invention is ability of the erase block selector to choose erase blocks from the unassociated pool to use in one of the super blocks based on the super block's intended type of the roles in the data storage system.

For example, the erase block selector may choose to build one of the super blocks using some of the erase blocks having a lower values of the age to use for hot data or build one of the super blocks using some of the erase blocks having a higher value of the age for cold data. Hot data is data that is used frequently, while cold data is not used frequently. The erase block selector can form one of the super blocks with some of the erase blocks based on whether the super blocks will be used for host data or metadata.

The erase block selector can build some of the super blocks having varying sizes based on engineering need. For example, the super blocks can have less than a full complement of the erase blocks based on the age of the erase blocks, the status of the data channels, the physical configuration of each of the memory dice, the state of the memory elements, or a combination thereof. In another example, because individual flash memory dice vary in their wear capability based on manufacturing and other physical properties, the erase block selector may use the age information to skip certain flash die when building one of the super blocks.

The data storage system includes a number of functions within the erase block selector. One of the functions assembles drives with memory components that have been configures the erase blocks into the super blocks. Another of the functions groups component of similar or same characteristics and like or same roles during normal runtime operations on the data storage system as the system ages. Another of the functions determines the super block metadata by aggregating erase block metadata.

The functions described above provide a process, implemented in the elements of the data storage system that are different for specific applications or purposes. For example, the process can form the data storage system with the components or the non-volatile memory devices that are more capable and another group of the drives with the components that are less capable. The functions described above can build the data storage system that uses a predetermined wide range of component and system characteristics to help improve performance and operations.

The data storage system can reconfigure and recycle the memory elements, such as the erase blocks and the super blocks, based on the operational capabilities. The memory elements are continuously regrouped, recycled, or reformed into groups of the erase blocks and the super blocks to get better or improved aging, endurance, and reliability of the data storage system. In other words, the memory elements are not all treated or determined to be identical as they are being used during the runtime operations.

Functions or operations of the controller of the data storage system as described above can be implemented using modules. The functions or the operations of the controller can be implemented in hardware, software, or a combination thereof. The modules can be implemented using the control unit, the read only memory unit, the random access memory unit, the memory interface unit, the host interface unit, the ECC unit, or a combination thereof.

The data storage system is described with module functions or order as an example. The modules can be partitioned differently. Each of the modules can operate individually and independently of the other modules.

Further, information generated in one module can be used by another module without being directly coupled to each other. Yet further, the modules can be implemented as hardware accelerators (not shown) within the control unit or can be implemented as hardware accelerators in the controller or outside of the controller. The controller can be coupled to the memory array and the host. The control unit can be coupled to the host interface, the memory interface, the ECC unit, the read only memory, and the random access memory.

The physical transformation of determining the configuration of the bits in the super blocks of the data storage system results in movement in the physical world, such as people using the data storage system based on the operation the super blocks and the erase blocks. As the movement in the physical world occurs, the movement itself creates additional information that is converted back to assigning the user data and metadata for the super blocks. The use of the user data that is updated during the runtime operations of the data storage system can continue the movement in the physical world. For example, one of the users can move the data storage system between different hosts to transfer data bits that are encoded the erase blocks of the super blocks.

It has been found that using the erase block selector to form super blocks from the erase blocks having similar ages improves performance. Grouping the erase blocks into a homogenous type of the super blocks reduces wear and promotes even usage.

It has been discovered that forming the super blocks based on the erase blocks having similar roles improves performance and promotes even wear across the memory dice. Tailoring the individual erase blocks base on role can maximize the effective use of the erase blocks.

It has been discovered that forming the super blocks based on the physical location of the erase blocks to evenly spread out the erase blocks over multiple memory dice improves performance. By supporting parallel operations that do not interfere with one another allows more operations to be performed simultaneously to increase performance.

Figure 5:
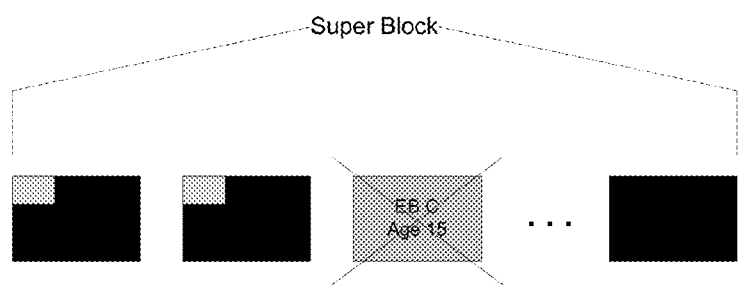
FIG. 5 is a first example of the configuration of one of the super blocks.

Referring now to FIG. 5, therein is shown a first example of the configuration of one of the super blocks. The super blocks can be grouped based on the age of the erase blocks.

The erase block selector can form one of the super blocks having N of the erase blocks. However, if some of the memory dice do not have any of the erase blocks with ages similar to the other ones of the erase blocks, then some of the memory dice can be skipped and a smaller one of the super blocks can be created.

It has been discovered that creating the super blocks with varying sizing can increase performance and efficiency by utilizing more of the available ones of the erase blocks. Forming the super blocks with a different number of similar erase blocks can effectively utilizing the available erase blocks. As flash memory dice variability increases, the ability to craft some of the super blocks based on the age becomes more valuable.

The erase blocks for one of the super blocks can be allocated based on the decision to recycle another of the super blocks. For example, if one of the super blocks requires more of the erase blocks having a certain age, then an existing one of the super blocks having similar values for the age can be recycled so the erase blocks of the new one of the super blocks can form the new one of the super blocks.

It has been discovered that device performance can be increased by recycling one of the super blocks that is not closely matched in age. Reforming one of the super blocks having more consistency and similarity increases performance and reduces wear.

The erase block metadata can be aggregated into the super block metadata when forming the super blocks. When the data storage system forms one of the super blocks, it can aggregate the erase block metadata for each of the erase blocks associated with the active one of the super blocks. The erase block metadata is associated with one of the super blocks but contains all the information needed to pull one of the super blocks apart again into the individual ones of the erase blocks components with all the individual values of the erase block metadata. The super block metadata is stored in the non-volatile NAND flash memory of the memory dice.

The super blocks can include a super block header and a super block footer. The super block header and the super block footer can be data storage areas for holding configuration information about the super blocks. The super block header and the super block footer can be stored in non-volatile memory, such as in the erase blocks.

The super block header and the super block footer can store the super block metadata. The super block metadata can include all of the erase block metadata from each of the erase blocks. The super block metadata can include information regarding the configuration of the super blocks such as list of the erase blocks, the age, general structural information, other a priori information about the hardware or software configuration, mapping information, LBA tables, physical to logical table information, performance information, or a combination thereof.

The super block metadata can be stored redundantly for data protection. The super block metadata can be stored in the super block header, the super block footer, one of the erase blocks, or a combination thereof. The super block metadata is stored in the non-volatile NAND flash memory die in a redundant fashion, so it can be preserved if one of the components of one of the super blocks becomes unusable, such as with a plane or die failure.

If one of the super blocks is used for a parity stripe, the super block metadata can provide the information needed to recover the lost data using parity. The data storage system can use a RAID-1 configuration to protect the data on in the super blocks and helps ensure that the data storage system can retrieve the information in the super blocks if any individual one of the erase blocks becomes unreadable.

It has been discovered that forming the super blocks having varying sizes improves efficiency and reduces errors. By maximizing the utilization of the erase blocks in the memory dice, more of the available erase blocks can be used reducing waste.

Figure 6:
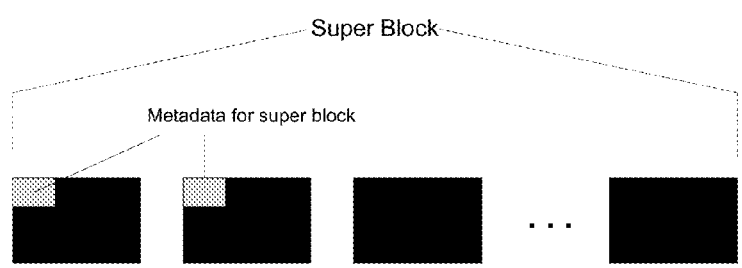
FIG. 6 is a second example of the configuration of one of the super blocks.

Referring now to FIG. 6, therein is shown a second example of the configuration of one of the super blocks. The super blocks can include the super block metadata including the erase block metadata. The super blocks can be configured across multiple of the memory dice. The super block metadata can be protected with RAID-1 to increase reliability for retrieving the super block metadata, offering protection before determining the type of association for each of the erase blocks.

The data storage system can include other aspects. The data storage system can leave some of the erase blocks in ungrouped pools as spare erase blocks or unassociated erase blocks, and group them together into the super blocks. The data storage system uses a persistent storage mechanism to store metadata about the unassociated erase blocks. The persistent storage mechanism can include the non-volatile NAND flash memory dice.

The data storage system sorts the unassociated erase blocks by criteria based on the erase block metadata to allow for grouping into one of the super blocks for improved wear leveling and performance. When the erase blocks are grouped into the super blocks, the erase block metadata for each of the erase blocks is aggregated in one of the super blocks to save space and endurance.

When the unassociated erase blocks are combined into one of the super blocks, the data storage system can use the erase block metadata to make informed decisions about how to build the super blocks for better wear and thus extend the drive's useful life.

For example, the data storage system can group the erase blocks with similar current or anticipated wear characteristics, so it can make better wear-leveling decisions about the entire super blocks. The data storage system can build the erase blocks have the lowest values of the age first, so they can have more wear applied to them.

The data storage system can use the relative wear of the erase blocks to make decisions about which of the erase blocks to use for different types of the roles within the super blocks. The data storage system can enforce a minimum dwell time for each of the erase blocks to be allowed to heal before re-use.

The data storage system can choose which flash components, such as the memory dice, to use when building the super blocks. For example, for a particular one of the super blocks the data storage system may skip using any of the erase blocks from a relatively worn one of the memory dice in order to apply less wear to it.

The data storage system can use the erase block metadata to determine how to build one of the super blocks based on the intended use of one of the super blocks.

The data storage system can choose some of the super blocks to recycle based to some extent on which of the erase blocks it would like to use to build new ones of the super blocks in the future.

It has been discovered that forming the super block metadata by aggregating the erase block metadata provides increased performance and improved operational integrity. Providing redundant information reduces the likelihood of failure of the data storage system by allowing the recovery of information in case of component failure.

Figure 7:
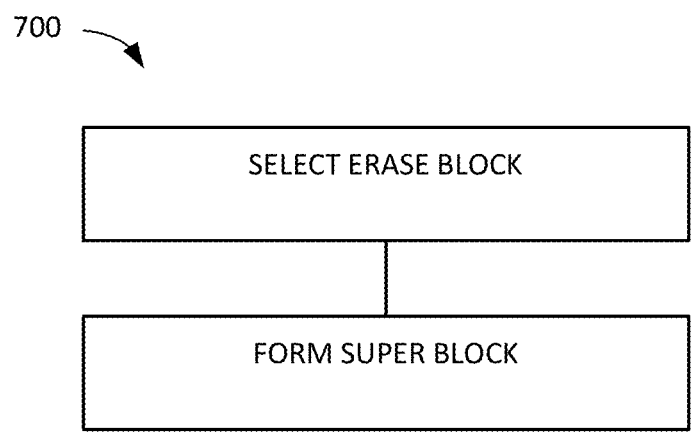
FIG. 7 is a flow chart of a method of operation of the data storage system in a further embodiment of the present invention.

Referring now to FIG. 7, therein is shown a flow chart of a method of operation of the data storage system of FIG. 1 in a further embodiment of the present invention. The method includes: selecting an erase block from an erase block pool in a block; and forming a super block having the erase block in another block.

Thus, it has been discovered that the data storage system of the present invention furnishes important and heretofore unknown and unavailable solutions, capabilities, and functional aspects for a data storage system with dynamic erase block grouping mechanism. The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

It will be understood that, although the terms "first," "second," etc. may be used herein to describe various elements, these elements should not be limited by these terms. These terms are only used to distinguish one element from another. For example, a first erase block could be termed a second erase block, and, similarly, a second erase block could be termed a first erase block, without changing the meaning of the description, so long as all occurrences of the "first erase block" are renamed consistently and all occurrences of the "second erase block" are renamed consistently. The first erase block and the second erase block are both erase blocks, but they are not the same erase block.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of operation of a data storage system comprising:
   maintaining metadata for each erase block of a plurality of erase blocks in the data storage system, wherein a respective metadata for a respective erase block includes one or more characteristics of the respective erase block;
   allocating a set of erase blocks, of the plurality of erase blocks, as unassociated erase blocks;
   selecting two or more unassociated erase blocks in accordance with characteristics of the unassociated erase blocks so as to select unassociated erase blocks with similar characteristics, wherein the selecting includes enforcing a minimum amount of dwell time for the unassociated erase blocks, wherein dwell time is the amount of time between operations on a respective erase block; and
   grouping the two or more unassociated erase blocks with similar characteristics to form a super block.

2. The method of claim 1, wherein the one or more characteristics of the respective erase block include at least one characteristic selected from the group consisting of age information, wear statistics, physical location, and operation parameters.

3. The method of claim 1, wherein the metadata is maintained in a persistent storage mechanism.

4. The method of claim 1, wherein the super block includes two or more unassociated erase blocks from different memory die of the data storage system.

5. The method of claim 1, wherein selecting two or more unassociated erase blocks in accordance with characteristics of the unassociated erase blocks so as to select unassociated erase blocks with similar characteristics includes selecting two or more unassociated erase blocks with similar ages.

6. The method of claim 1, wherein selecting two or more unassociated erase blocks in accordance with characteristics of the unassociated erase blocks so as to select unassociated erase blocks with similar characteristics includes:
   selecting a first unassociated erase block from a first die of the data storage system;
   selecting a second unassociated erase block from a second die of the data storage system; and
   forgoing selection of a third unassociated erase block from a third die of the data storage system, wherein the third die is relatively worn in comparison to the first die and second die.

7. The method of claim 1, further comprising:
   selecting one or more erase blocks, in accordance with the one or more characteristics of the one or more erase blocks, for recycling;
   recycling the selected one or more erase blocks; and
   allocating the recycled one or more erase blocks as unassociated erase blocks.

8. The method of claim 1, further comprising:
   selecting, from the super block, a relatively old erase block to store parity information.

9. A data storage system, comprising:
   one or more processors; and
   memory storing one or more programs to be executed by the one or more processors, the one or more programs comprising instructions for:
   maintaining metadata for each erase block of a plurality of erase blocks in the data storage system, wherein a respective metadata for a respective erase block includes one or more characteristics of the respective erase block;

allocating a set of erase blocks, of the plurality of erase blocks, as unassociated erase blocks;

selecting two or more unassociated erase blocks in accordance with characteristics of the unassociated erase blocks so as to select unassociated erase blocks with similar characteristics, wherein the selecting includes enforcing a minimum amount of dwell time for the unassociated erase blocks, wherein dwell time is the amount of time between operations on a respective erase block; and grouping the two or more unassociated erase blocks with similar characteristics to form a super block.

10. The data storage system of claim 9, wherein the one or more characteristics of the respective erase block include at least one characteristic selected from the group consisting of age information, wear statistics, physical location, and operation parameters.

11. The data storage system of claim 9, wherein the super block includes two or more unassociated erase blocks from different memory die of the data storage system.

12. The data storage system of claim 9, wherein selecting two or more unassociated erase blocks in accordance with characteristics of the unassociated erase blocks so as to select unassociated erase blocks with similar characteristics includes selecting two or more unassociated erase blocks with similar ages.

13. The data storage system of claim 9, wherein selecting two or more unassociated erase blocks in accordance with characteristics of the unassociated erase blocks so as to select unassociated erase blocks with similar characteristics includes:

selecting a first unassociated erase block from a first die of the data storage system;

selecting a second unassociated erase block from a second die of the data storage system; and forgoing selection of a third unassociated erase block from a third die of the data storage system, wherein the third die is relatively worn in comparison to the first die and second die.

14. The data storage system of claim 9, wherein the one or more programs further comprise instructions for:

aggregating metadata from the two or more selected erase blocks grouped to form the super block; and storing the aggregated metadata as metadata for the super block.

15. The data storage system of claim 9, wherein the one or more programs further comprise instructions for:

selecting one or more erase blocks, in accordance with the one or more characteristics of the one or more erase blocks, for recycling;

recycling the selected one or more erase blocks; and allocating the recycled one or more erase blocks as unassociated erase blocks.

16. A non-transitory computer readable storage medium, storing one or more programs configured for execution by one or more processors of a data storage system, the one or more programs including instructions for:

maintaining metadata for each erase block of a plurality of erase blocks in the data storage system, wherein a respective metadata for a respective erase block includes one or more characteristics of the respective erase block;

allocating a set of erase blocks, of the plurality of erase blocks, as unassociated erase blocks;

selecting two or more unassociated erase blocks in accordance with characteristics of the unassociated erase blocks so as to select unassociated erase blocks with similar characteristics, wherein the selecting includes enforcing a minimum amount of dwell time for the unassociated erase blocks, wherein dwell time is the amount of time between operations on a respective erase block; and grouping the two or more unassociated erase blocks with similar characteristics to form a super block.

17. The non-transitory computer readable storage medium of claim 16, wherein the one or more characteristics of the respective erase block include at least one characteristic selected from the group consisting of age information, wear statistics, physical location, and operation parameters.

18. The non-transitory computer readable storage medium of claim 16, wherein the super block includes two or more unassociated erase blocks from different memory die of the data storage system.

19. The non-transitory computer readable storage medium of claim 16, wherein selecting two or more unassociated erase blocks in accordance with characteristics of the unassociated erase blocks so as to select unassociated erase blocks with similar characteristics includes selecting two or more unassociated erase blocks with similar ages.

20. The non-transitory computer readable storage medium of claim 16, wherein selecting two or more unassociated erase blocks in accordance with characteristics of the unassociated erase blocks so as to select unassociated erase blocks with similar characteristics includes:

selecting a first unassociated erase block from a first die of the data storage system;

selecting a second unassociated erase block from a second die of the data storage system; and forgoing selection of a third unassociated erase block from a third die of the data storage system, wherein the third die is relatively worn in comparison to the first die and second die.

21. The non-transitory computer readable storage medium of claim 17, wherein the one or more programs further include instructions for:

aggregating metadata from the two or more selected erase blocks grouped to form the super block; and storing the aggregated metadata as metadata for the super block.

22. The non-transitory computer readable storage medium of claim 16, wherein the one or more programs further include instructions for:

selecting one or more erase blocks, in accordance with the one or more characteristics of the one or more erase blocks, for recycling;

recycling the selected one or more erase blocks; and allocating the recycled one or more erase blocks as unassociated erase blocks.

* * * * *